United States Patent
Thees et al.

(10) Patent No.: US 12,266,718 B2
(45) Date of Patent: Apr. 1, 2025

(54) VOLTAGE-CONTROLLED SWITCHING DEVICE WITH CHANNEL REGION

(71) Applicant: Infineon Technologies AG, Neubiberg (DE)

(72) Inventors: Hans-Juergen Thees, Dresden (DE); Alim Karmous, Dresden (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 523 days.

(21) Appl. No.: 17/668,793

(22) Filed: Feb. 10, 2022

(65) Prior Publication Data
US 2022/0262935 A1    Aug. 18, 2022

(30) Foreign Application Priority Data
Feb. 18, 2021   (EP) .................................... 21157941

(51) Int. Cl.
*H01L 29/739*   (2006.01)
*H02M 1/08*   (2006.01)
*H03K 17/567*   (2006.01)

(52) U.S. Cl.
CPC .......... *H01L 29/7397* (2013.01); *H02M 1/08* (2013.01); *H03K 17/567* (2013.01)

(58) Field of Classification Search
CPC ............... H01L 29/7397; H01L 29/083; H01L 29/0623; H01L 29/1095; H01L 29/42376;
(Continued)

(56) References Cited

U.S. PATENT DOCUMENTS

| | | | |
|---|---|---|---|
| 2010/0038724 A1* | 2/2010 | Anderson | H01L 29/517 438/275 |
| 2014/0334212 A1* | 11/2014 | Hashimoto | H01L 29/88 257/105 |

(Continued)

FOREIGN PATENT DOCUMENTS

| | | | |
|---|---|---|---|
| DE | 102018106670 A1 * | 9/2019 | |
| WO | 2012157608 A1 | 11/2012 | |

OTHER PUBLICATIONS

Huang, Alex Q., "Insulated Gate P—I—N Transistor—A new MOS Controlled switching Power Device", IEEE Electronic Device Letter, vol. 16, No. 9, Sep. 1995, pp. 408-410.

(Continued)

*Primary Examiner* — Amar Movva
*Assistant Examiner* — Sandra Milena Rodriguez Villan
(74) *Attorney, Agent, or Firm* — Murphy, Bilak & Homiller, PLLC

(57) ABSTRACT

A voltage-controlled switching device includes a drain/drift region of a first conductivity type formed in a semiconductor portion. A channel region and the drain/drift region are in direct contact with each other. A source region of a second conductivity type and the channel region are in direct contact with each other. A gate electrode and the channel region are capacitively coupled and configured such that, in a an on-state of the voltage-controlled switching device, a first enhancement region of charge carriers corresponding to the first conductivity type forms in the channel region and band-to-band tunneling is facilitated between the source region and the first enhancement region.

16 Claims, 11 Drawing Sheets

(58) Field of Classification Search
CPC ............... H01L 29/739; H01L 29/0684; H01L 29/1025; H01L 29/78; H01L 29/66333; H01L 29/66348; H01L 27/085; H01L 27/088; H02M 1/08; H03K 17/567
See application file for complete search history.

(56) References Cited

U.S. PATENT DOCUMENTS

| | | |
|---|---|---|
| 2017/0256642 A1 | 9/2017 | Huang |
| 2019/0189750 A1 | 6/2019 | Naito |
| 2020/0266273 A1 | 8/2020 | Zhao et al. |

OTHER PUBLICATIONS

Jiang, Huaping, et al., "Band-to-Band Tunneling Injection Insulated-gate Bipolar Transistor with a soft Reverse-recovery Built-in Diode", IEEE Electron Device Letters, vol. 33, No. 12, Dec. 2012, pp. 1684-1686.

* cited by examiner

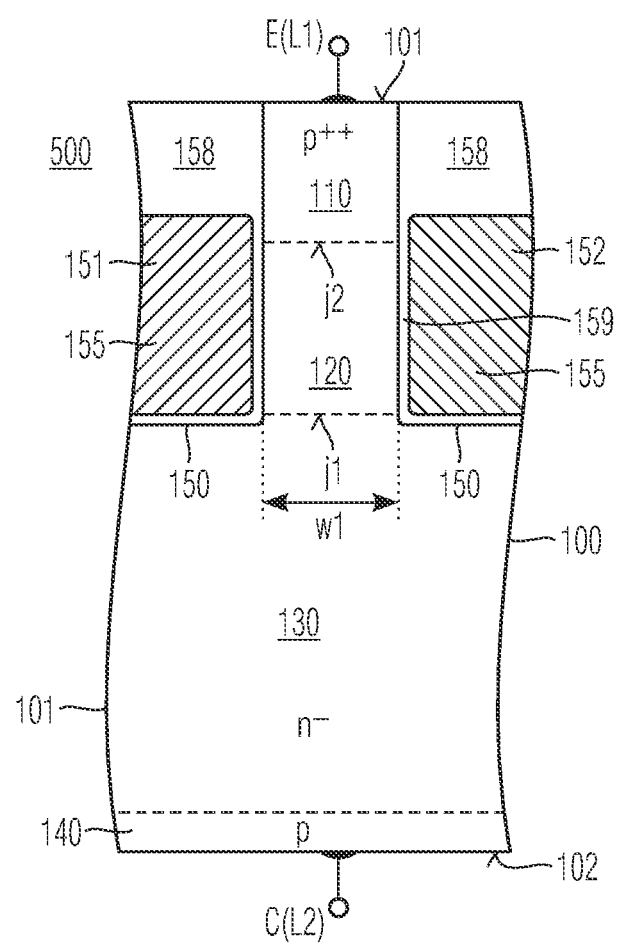

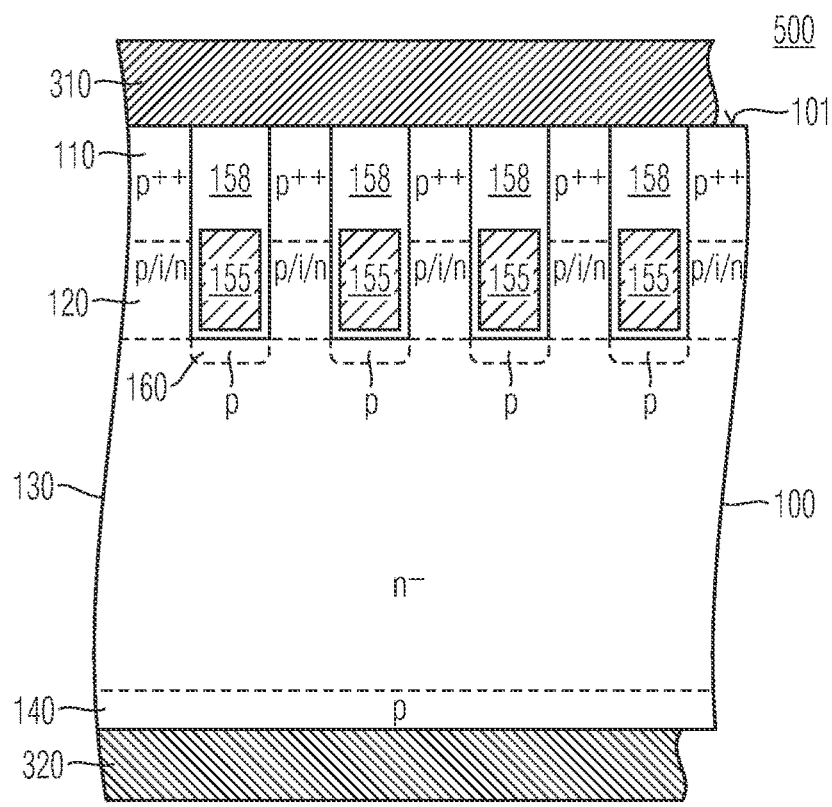
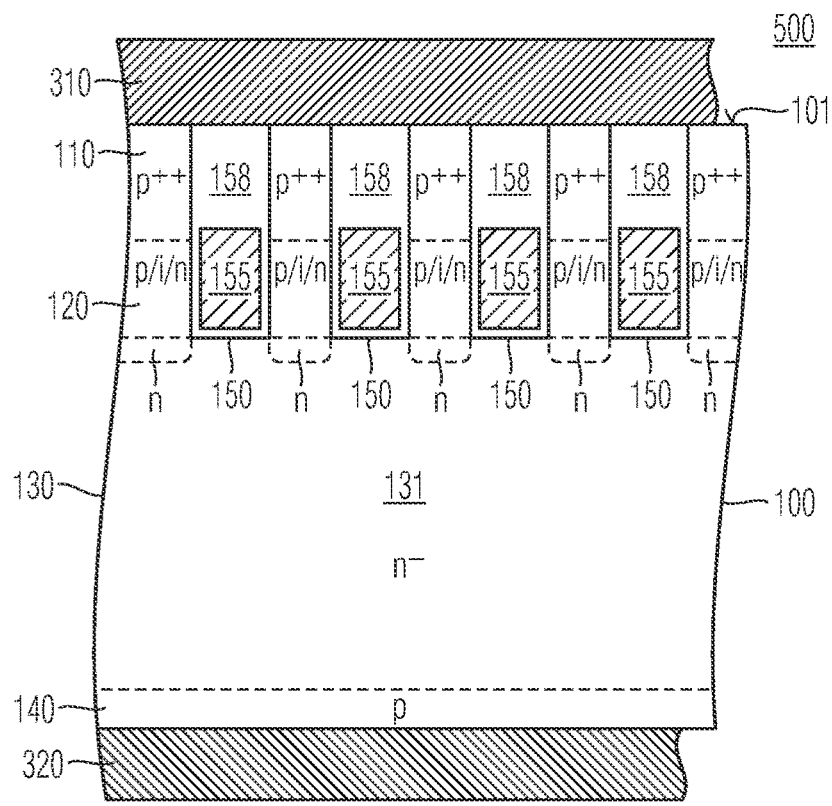

VOLTAGE-CONTROLLED SWITCHING DEVICE WITH CHANNEL REGION

TECHNICAL FIELD

Examples of the present disclosure relate to a voltage-controlled switching device, in particular to a power semiconductor device such as an insulated gate bipolar transistor.

BACKGROUND

Electrical circuits that convert electrical energy, e.g. DC-to-AC converters, AC-to-AC converters, and AD/DC converters, as well as electrical circuits that drive heavy inductive loads, e.g. motor driver circuits typically include power semiconductor switches such as IGBTs (insulated gate bipolar transistors) and MOSFETs (metal oxide semiconductor field effect transistors).

IGBTs typically feature a p-type backside emitter in addition to an n-channel MOSFET, which includes a lightly doped n-type drift region as the drain. When in the on-state electrons flowing through the n-channel of the MOSFET reach the backside emitter, the backside emitter emits holes into the drift zone. The developing electron/hole plasma in the drift zone provides the comparatively low on-state resistance the IGBT exhibits at comparatively high blocking voltages.

On turn-off, holes drain off from the drift region through a heavily doped p-type contact region or through a p-channel MOSFET, each electrically parallel to the n-type source region of the n-channel MOSFET.

There is a steady need for a voltage-controlled switching device with low on-resistance and high short-circuit withstand rating.

SUMMARY

An embodiment of the present disclosure relates to a voltage-controlled switching device including a drain/drift region of a first conductivity type, a channel region, a source region of a second conductivity type and a gate electrode. The drain/drift region is formed in a semiconductor portion. The channel region and the drain/drift region are in direct contact with each other. The source region and the channel region are in direct contact with each other. The gate electrode and the channel region are capacitively coupled and configured such that, in a an on-state of the voltage-controlled switching device, a first enhancement region of charge carriers corresponding to the first conductivity type forms in the channel region and band-to-band tunneling is facilitated between the source region and the first enhancement region.

A further embodiment of the present disclosure relates to a voltage-controlled switching device including a drain/drift region of a first conductivity type, a channel region, a source region of a second conductivity type and a gate electrode. The drain/drift region is formed in a semiconductor portion. The channel region and the drain/drift region are in direct contact with each other. The source region and the channel region are in direct contact with each other. The source region separates the channel region and a first surface at a front side of the semiconductor portion. The gate electrode and the channel region are capacitively coupled and configured such that, in a an on-state of the voltage-controlled switching device, a first enhancement region of charge carriers corresponding to the first conductivity type forms in the channel region and band-to-band tunneling is facilitated between the source region and the first enhancement region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a voltage-controlled switching device and together with the description serve to explain principles of the embodiments. Further embodiments are described in the following detailed description and the claims. Features of the various illustrated embodiments may be combined with each other.

FIG. 2 shows a simplified vertical cross-sectional view of a portion of a voltage-controlled switching device according to an embodiment with fully depleted channel region and vertical load current flow.

FIG. 5 shows a simplified vertical cross-sectional view of a portion of a voltage-controlled switching device according to an embodiment with patterned shielding layer.

FIG. 6 shows a simplified vertical cross-sectional view of a portion of a voltage-controlled switching device according to an embodiment with patterned barrier layer.

DETAILED DESCRIPTION

Figure 1A:
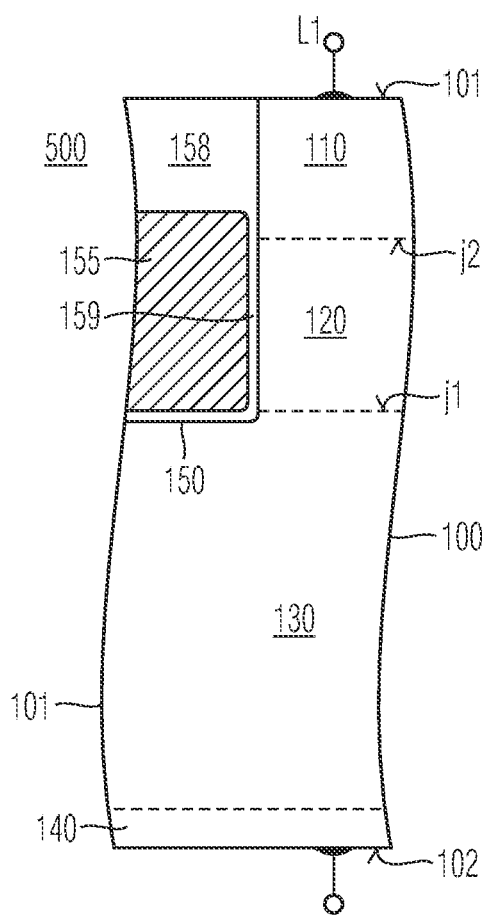
FIG. 1A shows a simplified vertical cross-sectional view of a portion of a voltage-controlled switching device based on band-to-band tunneling between a source region and a charge carrier enhancement region in the on-state according to an embodiment.

In the following detailed description, reference is made to the accompanying drawings, which form a part hereof and in which are shown by way of illustrations specific embodiments in which a voltage-controlled switching device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

An "ohmic contact" is a non-rectifying electrical junction with a linear or almost linear current-voltage characteristic.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor portion form a semiconductor junction. Two adjoining doping regions of the same conductivity type and with different dopant concentrations form a unipolar semiconductor junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity form a pn junction.

As regards structures and doped regions formed in a semiconductor portion, a second region is "below" a first region if a minimum distance between the second region and a first surface at the front side of the semiconductor portion is greater than a maximum distance between the first region and the first surface. The second region or a junction is "directly below" the first region, where the vertical projections of the first and second regions or the vertical projections of the first region and the junction into the first surface overlap. The vertical projection is a projection orthogonal to the first surface. A "horizontal plane" is a plane parallel to a planar first surface or parallel to coplanar surface sections of the first surface.

A voltage-controlled switching device may include a drain/drift region formed in a semiconductor portion, wherein the drain/drift region has a first conductivity type.

The semiconductor portion may have two essentially parallel main surfaces, which may have approximately the same shape and size. The semiconductor portion may have a surface extension along two horizontal directions and may have a thickness along a vertical direction perpendicular to the horizontal directions. In the following, the horizontal directions are also referred to as lateral directions, the main surface at the front side is referred to as first surface, and the main surface at the side opposite to the front side is referred to as second surface.

The semiconductor portion includes a semiconducting part formed from one or more single crystalline semiconductors. In addition to the semiconducting part, the semiconductor portion may include functional structures from other materials like polycrystalline silicon, dielectrics, elemental metals, metal compounds and/or metal alloys. The functional structures may be formed in trenches extending from the first and/or second surface into the semiconductor portion and/or may be formed on the first surface and/or on the second surface.

The drain/drift region may consist of or may include a lightly doped drift zone of the first conductivity type. In addition to the drift zone, the drain/drift region may include a more heavily doped barrier region at a side oriented to the first surface and/or a more heavily doped buffer layer at a side oriented to the second surface. The drain/drift region may form or may include one or more horizontal layer(s) extending laterally through the semiconductor portion. The drain/drift region may be or may include a layer grown by epitaxy. Alternatively, the drain/drift region may consist of or may include a mono crystalline semiconductor material grown by pulling or recrystallization of a polycrystalline ingot.

The voltage-controlled switching device may further include a channel region. The channel region and the drain/drift region may be in direct contact with each other. The channel region and the directly adjoining portion of the drain/drift region may have the same conductivity type and the same dopant concentration such that the channel region and the drain/drift region merge and form two sections of a homogenously doped structure.

Alternatively, the channel region and the drain/drift region may form a first semiconductor junction in the semiconductor portion. Said first semiconductor junction may be a junction between semiconductor regions of different conductivity types or of the same (i.e. the first) conductivity type. Said semiconductor regions of the same conductivity type may exhibit the same or different doping concentration.

The channel region may have the first conductivity type, may have a complementary second conductivity type or may be considered to be low doped or approximately intrinsic with a net dopant concentration of electrically active dopant atoms less than $5\times10^{16}$ cm$^{-3}$ (5E16 cm$^{-3}$) or even less than $5\times10^{14}$ cm$^{-3}$ (5E14 cm$^{-3}$). Accordingly, the first semiconductor junction may be a unipolar junction, a pn junction or a junction with an intrinsic region at one side.

The voltage-controlled switching device may further include a source region of the second conductivity type. The source region and the channel region may be in direct contact with each other. In particular, the source region and the channel region may form a second semiconductor junction in the semiconductor portion. Depending on the conductivity type of the channel region, the second semiconductor junction may be a unipolar junction, a pn junction or a junction with an intrinsic semiconductor region at one side.

The voltage-controlled switching device may further include a gate electrode. The gate electrode and the channel region are capacitively coupled to each other and are configured such that, in an on-state of the voltage-controlled switching device, a first enhancement region of charge carriers corresponding to the first conductivity type forms in the channel region and band-to-band tunneling can occur between the source region and the first enhancement region when the drain/drift region is sufficiently biased.

A gate dielectric may separate the gate electrode and the channel region. A gate signal applied between gate electrode and source region may control the distribution of mobile charge carriers in the channel region by field effect.

The gate signal is defined by a gate-to-source voltage VGS effective between the gate electrode and the source region. An active gate signal with a gate-to-source voltage VGS exceeding an on-state threshold voltage Vthon turns on the voltage-controlled switching device. In presence of an active gate signal, mobile charge carriers corresponding to the first conductivity type accumulate in the first enhancement region, which includes at least an on-channel portion of the channel region, wherein the on-channel portion extends from the source region to the drain/drift region. By forming the first enhancement region, the active gate signal turns on the voltage-controlled switching device.

The accumulating mobile charge carriers are electrons in case the first conductivity type is n conductivity and are holes in case the first conductivity type is p conductivity.

In addition, the gate electrode, the channel region and the source region are configured such that tunneling, in particular band-to-band tunneling, is facilitated between the source region and the first enhancement region. In particular, the doping level in the source region may be sufficiently high and the doping profile orthogonal to the second semiconductor junction may be sufficiently abrupt such that band-to-band tunneling between the source region and the first enhancement region occurs when, for operational conditions within the limits set by the SOA, at the same time with an active gate signal a sufficiently high potential difference is effective between the drain/drift region and the source region.

For the following example, the first conductivity type is n conductivity and the second conductivity type is p conductivity. Accordingly, the drain/drift region is n conducting and the source region is p conducting. The channel region may be intrinsic, lightly n doped or lightly p doped. The mobile charge carriers accumulating in the first enhancement region are electrons.

When the gate-to-source voltage VGS applied between the gate electrode and the source region exceeds the on-state threshold voltage Vthon, electrons accumulate in at least the on-channel portion of the channel region and form the first enhancement region, wherein the voltage-controlled switching device turns on. Depending on the conductivity type of the channel region, the first accumulation region may form an inversion channel or an accumulation channel.

At a sufficiently high voltage drop between the drain/drift region and the source region, electrons tunnel from the source region into the first enhancement region and flow to the drain/drift region. In a stationary forward operation mode of the voltage-controlled switching device the tunneling electrons supply a steady tunnel current from the source region. As soon as the gate-to-source voltage VGS falls below the on-state threshold voltage Vthon, the concentration of electrons in the first enhancement region drops and tunneling of electrons from the source region into the first enhancement region is reduced. Finally, the first enhancement region disappears and the voltage-controlled switching device turns off.

The voltage-controlled switching device facilitates controlling a load current between the source region and the drain/drift region in a way similar to an n-channel MOSFET but without n conducting structure at the source side. The absence of n conducting regions in the control head on the source side of the n-channel MOSFET avoids the possibility that a flow of holes near n conductive regions can generate a sufficiently high voltage drop to trigger a latch-up. The voltage-controlled switching device may be inherently latch-up safe.

According to an embodiment, the voltage-controlled switching device may include a collector layer. The collector layer may be in direct contact with the drain/drift region, wherein the drain/drift region is between the collector layer and the channel region. For example, the drain/drift region separates the channel region and the collector layer. The collector layer may include a continuous collector layer of the second conductivity type or may include a plurality of laterally separated collector zones of the second conductivity type. The collector layer is effective as rear side charge carrier emitter layer, wherein the emitted charge carriers correspond to the second conductivity type. For example, the emitted charge carriers are holes in case the second conductivity type is p conductivity.

In particular, the voltage-controlled switching device may be an IGBT with a TFET (tunnel field effect transistor) control head. The voltage-controlled switching device may be or may include a reverse blocking IGBT with one complete, continuous collector layer without gaps. Alternatively, the voltage-controlled switching device may be or may include an RC(reverse conducting)-IGBT including a discontinuous collector layer with gaps, or a RC-IGBT with a plurality of laterally separated collector zones, wherein the collector layer may further include channel zones of the first conductivity type in the gaps of the discontinuous collector layer or between the collector zones.

Referring again to the example with n conducting drain/drift region and with electrons travelling across the drain/drift region in the on-state of the voltage-controlled switching device, the electrons reaching at the collector layer may cause the injection of holes from the collector layer into the drain/drift region. An electron/hole plasma of high electrical conductivity builds up in the drain/drift region. Since the positive gate-to-source voltage applied to the gate electrode makes it more difficult for the holes to leave the drain/drift region through the channel region, a higher density of holes can be achieved in a portion of the drain/drift region close to the channel region compared to a portion of the drain/drift region close the collector layer.

According to an embodiment, the gate electrode and the channel region may be configured such that a second enhancement region of charge carriers corresponding to the second conductivity type forms in the channel region during a turn-off mode of the voltage-controlled switching device and may be maintained in the turn-off mode.

In addition, the gate electrode and the channel region may be configured such that at the time the second enhancement region is formed, charge carriers of the first conductivity type are still able to cross the channel region. For example, with the first conductivity type being n conductivity, the gate electrode and the channel region may be configured such that for a certain time during and/or after turn-off, both holes and electrons pass the channel region. In particular, for a certain time at the beginning of turn-off, electron tunneling may still be possible from the source region into the first enhancement region and at the same time the shielding effect of the gate electrodes is sufficiently reduced to facilitate a flow of holes from the drain/drift region through the channel region into the source region.

Referring again to the example with n conducting drain/drift region and p conducting source region, a turn-off gate signal with a gate-to-source voltage VGS below a turn-off threshold voltage VthturnOff accumulates holes in the second enhancement region that extends at least across an off-channel portion of the channel region. The second enhancement region forms a p-channel through which the holes drain off from the drain/drift region.

The turn-off threshold voltage VthturnOff is lower than the on-state threshold voltage Vthon and may be adjusted by properly selecting the work function of the material of the gate electrode. The turn-off threshold voltage VthturnOff may be negative or positive, wherein the control head may operate as normally-off p-channel MOSFET when the turn-off threshold voltage VthturnOff is negative or as normally-on p-channel MOSFET when the turn-off threshold voltage VthturnOff is positive.

Draining off the holes through the second charge carrier enhancement region and the heavily doped source region may improve the switching characteristics of the voltage-controlled switching device. Since the holes do not pass along heavily doped n conducting region at the side of the source region, the risk of generating electron/hole pairs and the occurrence of latch-up phenomena are significantly reduced compared to conventional IGBTs with a control head including n-channel MOSFETs with npn structure.

The gate signal may strictly alternate between an active on-state gate signal and the turn-off gate signal. Alternatively, the gate signal may include periods with a stationary off-state gate signal and/or with a RC (reverse conducting) gate signal, wherein a level of the stationary off-state gate signal and a level of the RC gate signal may be lower than the turn-off threshold voltage VthturnOff and the on-state threshold voltage VthOn.

According to an embodiment, the gate electrode and the channel region may be configured such that in the on-state of the voltage-controlled switching device the first enhancement region extends across a complete cross-section of the channel region orthogonal to the current flow direction.

In addition, the gate electrode and the channel region may be configured such that tunneling from the source region into the first enhancement region may occur across the complete cross-section of the channel region orthogonal to the current flow direction such that a high tunnel current can be obtained.

In addition, the gate electrode and the channel region may be configured such that also the second enhancement region extends across a complete cross-section of the channel region orthogonal to the current flow direction in the turn-off mode.

According to an embodiment, the source region may be p conductive and a p-type net dopant concentration in the source region is sufficiently high such that the Fermi level in the source region is in the valence band.

Alternatively, the source region may be n conductive and an n-type net dopant concentration in the source region is sufficiently high such that the Fermi level in the source region is in the conduction band.

In particular, the source region may include a degenerate semiconductor such that tunneling from the source regions is possible at comparatively moderate gate voltages and moderate drain-to-source bias.

According to an embodiment, the gate electrode may include a first gate electrode section at a first side of the channel region and a second gate electrode section at an opposite second side of the channel region. The first and second gate electrode sections may be configured to fully deplete the channel region at a stationary off-state voltage VGSoff within the limits set by the SOA. In addition, the gate electrode may include one or more further gate electrode sections on further sides of the channel region.

The stationary off-state voltage VGSoff may be between the on-state threshold voltage Vthon and the turn-off threshold voltage Vthturnoff. For a voltage-controlled switching device with n conducting drain/drift region, the stationary off-state voltage VGSoff may be lower than the on-state threshold voltage Vthon and higher than the turn-off threshold voltage Vthturnoff.

In particular a width w1 of the channel region between the opposing gate electrode sections, a net dopant concentration in the channel region, and a material configuration of the gate electrode are selected such that for the stationary off-state voltage VGSoff the channel region is completely depleted ("fully depleted") from mobile charge carriers of the first conductivity type and such that for a gate-to-source voltage VGS above the on-state threshold voltage Vthon the electric fields induced from opposite sides in the channel region interact in a way that a bulk channel of charge carriers corresponding to the first conductivity type forms in the channel region.

According to an embodiment, the width w1, the net dopant concentration Nch in the channel regions, and the material configuration of the gate electrode are selected such that in a stationary off-state and for a gate-to-source voltage VGS=0V the depletion zones extending from the opposing gate electrode sections into the intermediate channel region overlap each other and the channel region is completely depleted from mobile charge carriers of the first conductivity type.

According to an embodiment, the gate electrode may be formed in gate structures extending from a first surface at a front side of the semiconductor portion into the semiconductor portion. The channel portion may be formed in a fin of the semiconductor portion between two or more neighboring gate structures.

For example, the gate structures may form parallel stripes of uniform width and with longitudinal axes extending along a first lateral direction. The gate electrode may include stripe gates and each gate structure may include one stripe gate and a portion of a gate dielectric separating the gate electric and the channel region.

The section of the semiconductor portion between two neighboring gate structures forms a fin in which the channel region and the source region are formed. The stripe gates provide sufficiently good electrostatic control of the channel region to enable manufacture of voltage-controlled switching devices with high reproducibility of device parameters.

In particular, a width w1 of the channel region from a first one of the neighboring gate structures to a second one may be at most 100 nm, e.g. at most 80 nm or 50 nm, wherein excellent electrostatic control of the channel region and highly uniform device parameters can be achieved across a production lot and between production lots.

According to an embodiment, the semiconductor material of the semiconductor portion is silicon and a net dopant concentration in the channel region may be less than $5 \times 10^{16}$ cm$^{-3}$ (5E16 cm$^{-3}$), less than $5 \times 10^{15}$ cm$^{-3}$ (5E15 cm$^{-3}$) or even less than $5 \times 10^{14}$ cm$^{-3}$ (5E14 cm$^{-3}$). In particular, the channel region may be intrinsic or almost intrinsic to form a steep transition between the doping in the source region and the doping in the channel region such that a sufficient band bending for a sufficiently high tunnel current between the source region and the first enhancement region can be achieved.

According to an embodiment, along a direction orthogonal to a junction (second semiconductor junction) between the source region and the channel region a net dopant concentration in the source region drops by at least one order of magnitude (one decade) per 5 nm into direction of the channel region such that a sufficient band bending for a sufficiently high tunnel current between the source region and the first enhancement region can be achieved.

According to an embodiment the source region may completely separate the channel region and the first surface at the front side of the semiconductor portion. In other words, no doped region of the first conductivity type is formed between the emitter electrode and the channel region. At least no doped region of the first conductivity type and with a doping level sufficiently high to form an ohmic contact with the emitter electrode is formed between the emitter electrode and the channel region.

According to another embodiment, the voltage-controlled switching device may include a pilot source region of the first conductivity type. The channel region may separate the pilot source region and the drain/drift region.

The source region of the second conductivity type and the pilot source region of the first conductivity type may laterally directly adjoin to each other. A front side load electrode may be in direct contact with both the source region and the pilot source region. In particular, the front side load electrode and the source region form a low-resistive ohmic contact and the front side electrode and the pilot source region form a low-resistive ohmic contact.

The pilot source region provides an n channel MOSFET in parallel to the TFET in the control head of the voltage-controlled switching device, wherein in particular for small channel widths below 100 nm the n channel MOSFET may have a channel region of arbitrary conductivity type. In other words, the n channel MOSFET may have an nnn structure, an nin structure or an npn structure (summarized as n*n structure in the following). The n channel MOSFET with n*n structure may be designed to complement the characteristics of the TFET in a predetermined way.

In case the n channel MOSFET and the TFET include equally doped channel regions and equally configured gate structures such that the n channel MOSFET differs from the TFET only in the presence of the source region, an on-state threshold voltage Vthon of the n channel MOSFET may be approximately the same as that of the TFET.

Even at equal on-state threshold voltages Vthon, the TFET may show a higher transconductance (>60 mV/decade) than a unipolar FinFET, because after establishing a conductive channel in the channel region, the concentration of charge carriers in the channel must reach a certain—higher—level prior to on-set of the tunnel effect and thus on-set of the load current. Therefore, the TFET may exhibit a rather steep and hard-to-control turn-on characteristic. A parallel n channel MOSFET with the same or with a lower on-state threshold voltage Vthon than the TFET may positively influence the turn-on behavior. In particular, the n channel MOSFET may soften the turn-on characteristic.

The parameters of the n channel MOSFET may be selected such that the n channel MOSFET provides a significant portion of the load current only during turn-on. After the TFET has fully turned on, the TFET may carry the greater portion of the load current.

According to an embodiment, the voltage-controlled switching device may include a plurality of the pilot source regions and a plurality of the source regions, wherein the pilot source regions and the source regions may alternate along a lateral direction such that the current carried by the n channel MOSFET distributes more evenly across the semiconductor portion.

In particular, the pilot source regions, the source regions and the channel region may be formed in a fin of the semiconductor portion and the pilot source regions and source regions alternate along the horizontal direction defined by a longitudinal extension of the fin.

An area ratio of the total horizontal area of the pilot source regions to the total horizontal area of the source regions of the second conductivity type may be in a range from 1:5 to 1:100, e.g., about 1:20.

Figure 1B:
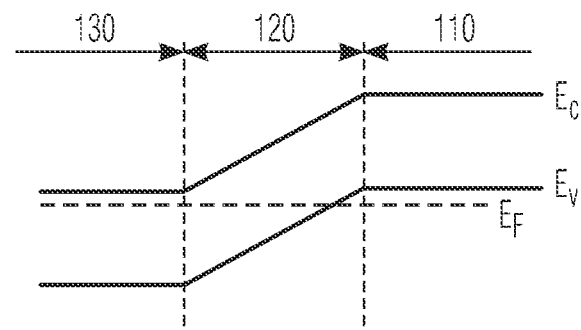
FIGS. 1B-1C show band diagrams for discussing operational modes of the voltage-controlled switching device illustrated in FIG. 1A.
Figure 1C:
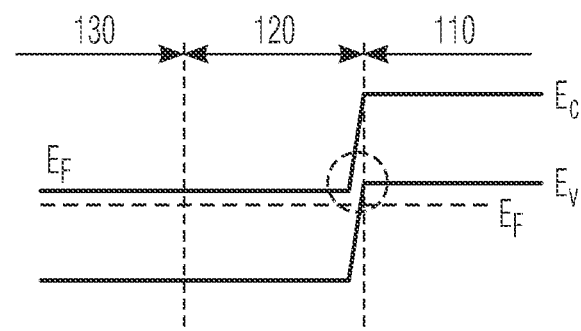

FIGS. 1A to 1C refer to a voltage-controlled switching device 500 using a tunnel current in the on-state.

The voltage-controlled switching device 500 includes a drain/drift region 130 of a first conductivity type, a collector layer 140 of a complementary second conductivity type and a control head with one or more transistor cells TC, wherein each transistor cell TC includes a source region 110 of the second conductivity type and a channel region 120. The source region 110, the channel region 120, the drain/drift region 130 and the collector layer 140 are formed in a semiconductor portion 100.

The semiconductor portion 100 includes a semiconducting part formed from one or more single crystalline semiconductor(s). The semiconductor(s) may include group IV elemental semiconductors, e.g. silicon (Si) or germanium (Ge), group IV compound semiconductors, e.g. silicon carbide (SiC) or silicon germanium (Site), or group III-V semiconductors such as gallium nitride (GaN), aluminum gallium nitride (AlGaN) or gallium arsenide (GaAs), by way of example. For example, the semiconductor may be SiC with a hexagonal polytype like 2H-SiC, 4H-SiC or 6H-SiC. In addition to the main constituent or the main constituents, the semiconductor may include dopant atoms, for example nitrogen (N), phosphorous (P), beryllium (Be), boron (B), aluminum (Al), arsenic (As) and/or gallium (Ga). The semiconductor may also include other impurities such as hydrogen (H), fluorine (F), carbon (C) and/or oxygen (O).

The semiconductor portion 100 has two essentially parallel main surfaces, which may have approximately the same shape and size. The main surface at the front side is referred to as first surface 101 and the main surface opposite to the front side is referred to as second surface 102 in the following.

The semiconductor portion 100 has a surface extension along two horizontal directions. The horizontal directions are parallel to an x-axis and to a y-axis, wherein x-axis and y-axis are orthogonal to each other. The semiconductor portion 100 has a thickness along a vertical direction perpendicular to the horizontal directions. The vertical direction is parallel to a z-axis, which is orthogonal to the x-axis and to the y-axis. In the following, the horizontal directions are also referred to as lateral directions.

The source region 110 extends from the first surface 101 into the semiconductor portion 100. The drain/drift region 130 may extend horizontally through the complete horizontal cross-section of the semiconductor portion 100. The channel region 120 may separate the source region 110 and the drain/drift region 130. The channel region 120 and the drain/drift region 130 form a first semiconductor junction j1. The channel region 120 and the source region 110 form a second semiconductor junction j2. The collector layer 140 may extend from the second surface 102 into the semiconductor portion 100 and separates the drain/drift region 130 and the second surface 102. A transition between the doping level in the source region 110 and the channel region 120 may be comparatively steep.

The voltage-controlled switching device 500 further includes one or more gate structures 150. Each gate structure 150 includes a part of a conductive gate electrode 155 and a portion of a gate dielectric 159 between the gate electrode and at least the channel region 120. The gate dielectric 159 may completely separate the gate electrode 150 and the semiconducting part of the semiconductor portion 100.

The gate electrode 155 extends along the complete extension of the channel region 120 between the source region 110 and the drain/drift region 130 and may overlap with the source region 110 and/or with the drain/drift region 130.

In addition to the gate electrode 155 and the gate dielectric 159, the gate structure 150 may include further conductive and dielectric structures.

According to the illustrated embodiment, the gate structure 150 extends from the first surface 101 into the semiconductor portion 100 to or into the drain/drift region 130 and the gate structure 150 includes a cap dielectric 158 between the plane of the first surface 101 and the gate electrode 155.

A first load terminal L1 is electrically connected or coupled to the source region 110. A second load terminal L2 is electrically connected or coupled to the collector layer 140. A gate terminal G is electrically connected or coupled to the gate electrode 155.

A plurality of transistor cells TC may be electrically connected with the load paths in parallel between the first load terminal L1 and the second load terminal L2, wherein the transistor cells TC are controlled through the same gate signal applied to the gate terminal G.

The source region 110 may be formed from a degenerate semiconductor with a doping level sufficiently high such that the semiconductor acts rather like a metal than as a semiconductor.

FIGS. 1B and 1C show band diagrams along a plane running close to the gate structure 150 and orthogonal to the first and second semiconductor junctions j1, j2 in case the source region 110 is p conducting. In the degenerate source region 110, the upper edge EV of the valence band is above the Fermi level. In the drain/drift region 130 the Fermi level EF may be within the band gap.

In FIG. 1B no gate voltage (VGS=0) is applied to the gate terminal G. In the channel region 120, the edges EC, EV of conduction band and valence band show gradual, approximately linear transitions form their positions in the source region 110 to their positions in the drain/drift region 130. The probability for electrons to tunnel from the source region 110 across the channel region 120 into the drain/drift region 130 is low.

In FIG. 1C an active gate signal with a voltage level exceeding the on-state threshold voltage Vthon is applied to the gate terminal G. The field effect causes an accumulation of electrons in the channel region 120 and locally bends the edges of conduction band and valence band approximately to their levels in the drain/drift region 130. At the second semiconductor junction j2 the probability for electrons to tunnel from the source region 110 into the accumulation layer is high, provided a sufficiently high positive potential biases the drain/drift region 130 with respect to the source region 110.

Figure 3:
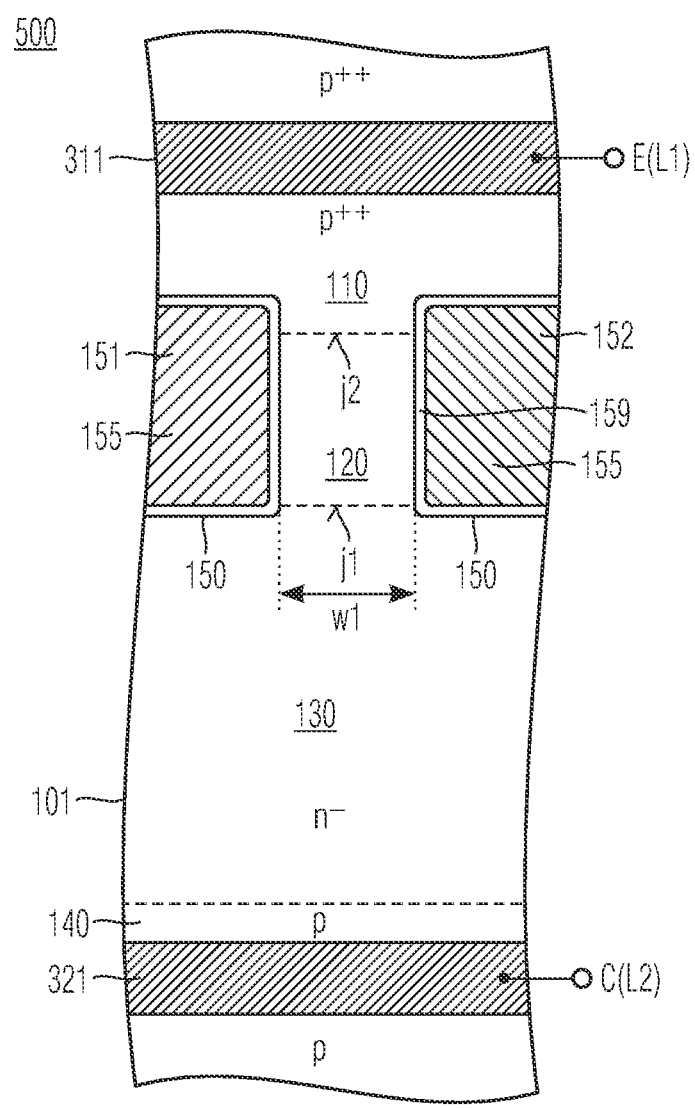
FIG. 3 shows a simplified horizontal cross-sectional view of a portion of a voltage-controlled switching device according to an embodiment with fully depleted channel region and horizontal load current flow.

Each of FIG. 2 and FIG. 3 shows a voltage-controlled switching device 500 with the gate electrode 155 including a first gate electrode section 151 at a first side of the channel region 120 and with a second gate electrode section 152 at an opposite second side of the channel region 120. The gate electrode 155 is configured to fully deplete the channel region 120 at a stationary off-state voltage VGSoff, which may be 0V, by way of example.

The drain/drift region 130 is n conducting. The source region 110 is heavily p doped. The channel region 120 may be intrinsic, lightly p doped or lightly n doped. The collector layer 140 is p doped with a dopant concentration sufficiently high such that the second load electrode L2 and the collector layer 140 form a low resistive ohmic contact. The first load electrode L1 forms an emitter electrode E. The second load electrode L2 forms a collector electrode C.

A gate-to-source voltage VGS is defined as the electric potential difference applied between the gate electrode 155 and the source region 110 by an external voltage source. The applied gate voltage VGS adds to a built-in voltage $V_{BT}$ resulting from the different work functions of the gate structures 150 and the channel region 120. Fixed charge carriers located in the gate dielectric 159 and/or at the interface of the gate dielectric 159 may contribute to the built-in voltage $V_{BT}$. The built-in voltage $V_{BT}$ may effect that in the absence of any externally applied gate-to-source voltage VGS, i.e., for VGS=0V, depletion zones laterally extend from the interfaces between the channel region 120 and the gate structures 150 into the channel region 120.

The channel width w1, the dopant concentration $N_{ch}$ in the channel region 120, and the material configuration of the gate structures 150 are selected such that for VGS=0V depletion zones extending from opposite gate structures 150 into the intermediate channel region 120 overlap and the channel region 120 is completely depleted from mobile charge carriers of the first conductivity type.

With increasing gate-to-source voltage VGS, the electrostatic potential increases uniformly in the channel region 120. At a gate-to-source voltage VGS greater than the on-state threshold voltage Vthon electrons accumulate in a first enhancement region and form a charge carrier channel.

In case of a p conducting channel region 120, volume-inversion may come into effect and the electrons accumulating in the first enhancement region form an inversion channel with a lateral width equal to the channel width w1. In case of an n conducting channel region 120, volume-accumulation may come into effect and electrons accumulating in the first enhancement region form an inversion channel with a lateral width equal to the channel width w1. The on-state threshold voltage Vthon is given by, inter alia, the work functions of the gate electrode 155 and the channel region 120, and may be in a range from 0.2V to 5V, e.g., in a range from 0.3V to 1V.

Referring again to the example with p conducting source region 110, electrons form the bulk channel and the channel region 120 may be completely in inversion ("volume-inverted") or may be completely in accumulation ("volume-accumulated") depending on the conductivity type of the channel region 120.

A p conducting channel region 120 is "completely in inversion" or "volume-inverted", if at least in a portion of the channel region 120 a complete cross-section orthogonal to the charge carrier flow is in inversion. The wording "completely in inversion" and "volume-inverted" may include that an end portion of the channel region 120 in direction of the drain/drift region 130 is not completely in inversion.

Bulk channels provide charge carriers with high mobility in the on-state of the voltage-controlled switching device 500. Providing the whole fin cross-section for the charge carrier flow may result in comparatively low channel on-state resistance. Since a high portion of the charge carriers flow at a distance to the gate dielectric, interface states and surface-induced scattering effects along the gate dielectric have only low adverse impact on the charge carrier flow in the channel region.

FIG. 2 shows a vertical cross-section of a voltage-controlled switching device 500 with vertical load current flow. The collector layer 140 extends from the second surface 102 into the semiconductor portion 100. The source region 110 extends form the first surface 101 into the semiconductor portion 100. The collector layer 140, the drain/drift region 130, the channel region 120 and the source region 110 are vertically stacked in this order starting from the second surface 102. The gate structures 150 extend from the first surface 101 to or into the drain/drift region 120. Each gate structure 150 includes a cap dielectric 158 between the plane of the first surface 101 and the gate electrode 155. The load current flows in vertical direction between the first surface 101 and the second surface 102.

FIG. 3 shows a horizontal cross-section of a voltage-controlled switching device 500 with lateral load current flow. Each of the collector layer 140, the drain/drift region 130, the channel region 120 and the source region 110 extends from the first surface into the semiconductor portion 100. The collector layer 140, the drain/drift region 130, the channel region 120 and the source region 110 are laterally aligned in this order between an emitter contact structure 311 extending from the first surface into the semiconductor portion 100 and a collector contact structure 321 extending from the first surface into the semiconductor portion 100. The emitter contact structure 311 and the collector contact structure 321 may include a metal, e.g. an elemental metal, a metal compound and/or a metal alloy. The gate structures 150 extend from the first surface 101 into the semiconductor portion, wherein gate structures 150 and channel regions 120 may alternate along a horizontal direction orthogonal to the load current flow. The load current flows in lateral direction between the emitter contact structure 311 and the collector contact structure 321.

Figure 4A:
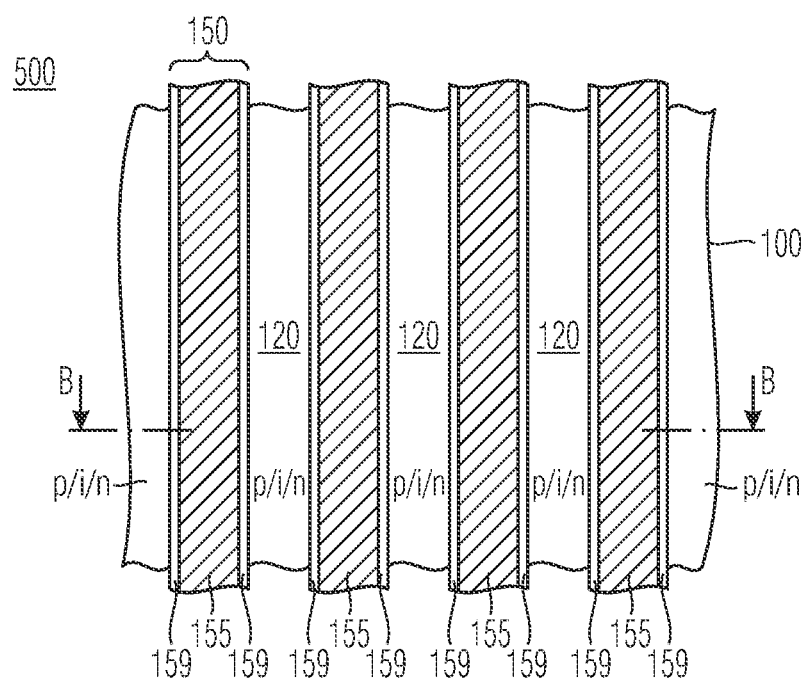
FIGS. 4A-4B show a simplified horizontal and a simplified vertical cross-sectional view of a portion of a voltage-controlled switching device according to another embodiment with fully depleted channel regions.
Figure 4B:
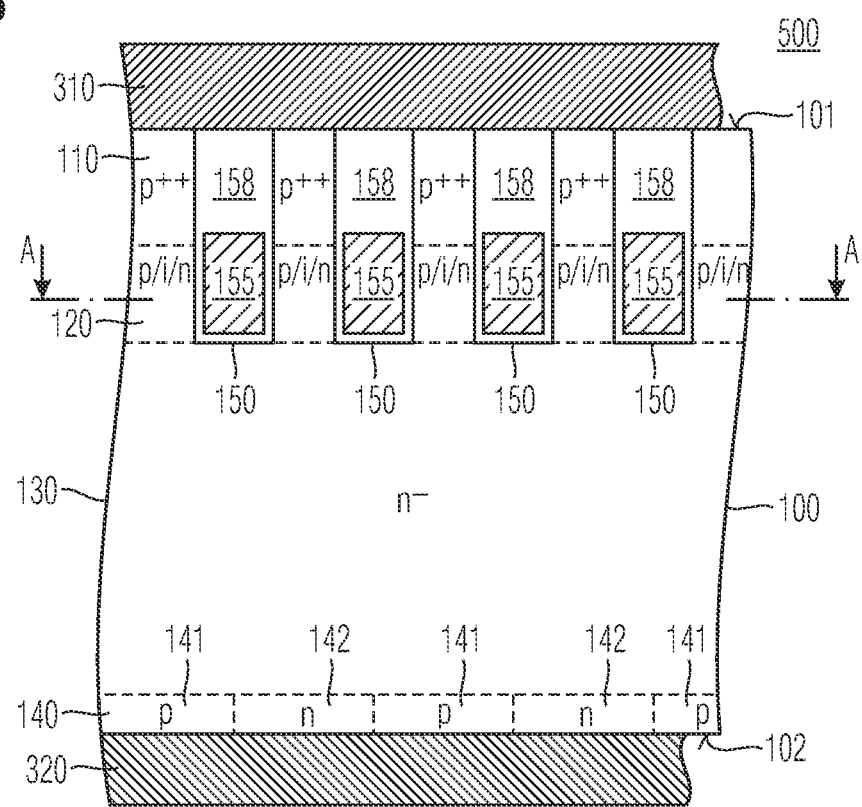

FIGS. 4A and 4B refer to a voltage-controlled switching device 500 with the gate electrode 155 formed in a plurality of gate structures 150 extending from the first surface 101 at a front side of the semiconductor portion 100 into the semiconductor portion 100.

The gate structures 150 may form parallel stripes of uniform width at uniform distances between the gate structures 150. Horizontal longitudinal axes of the gate structures 150 extend along a first lateral direction. The gate electrode 155 may include stripe gates, wherein each gate structure 150 includes one stripe gate and a portion of a gate dielectric 159 separating the gate electric 155 and the channel region 120.

A section of the semiconductor portion 100 between two neighboring gate structures 150 forms a fin. Each fin may include one channel region 120 and one or more source regions 110.

A metal emitter electrode 310 may be formed on the first surface 101. The emitter electrode 310 and the source regions 110 form low-resistive ohmic metal/semiconductor contacts. The emitter electrode 310 may form or may be electrically connected or coupled to an emitter terminal. A metal collector electrode 320 may be formed on the second surface 102. The collector electrode 320 and the collector layer 140 form a low-resistive ohmic metal/semiconductor contact. The collector electrode 320 may form or may be electrically connected or coupled to a collector terminal.

In addition, FIG. 4B shows a collector layer 140 including a plurality of laterally separated p conducting collector zones 141, wherein the collector layer 140 further includes n conducting channel zones 142 between the p conducting collector zones 141. The n conducting channel zones 142 may enable a reverse-conducting diode mode of the voltage-controlled switching device 500, which may be or may include an RC-IGBT.

The lateral dimensions of the n conducting channel zones 142 and the p conducting collector zones 141 may differ from FIG. 4B. For example, the lateral dimension of one or both of the n conducting channel zones 141 or the p conducting collector zones may be larger than 10 times or even larger than 100 times of the lateral dimension of a channel region 120 and a gate structure 150.

FIG. 5 shows sections of a patterned shielding layer 160 formed between the gate structures 150 and the drain/drift region 130. The sections of the patterned shielding layer 160 may separate the gate structures 150 and the drain/drift region 130. The sections of the patterned shielding layer 160 may be exclusively formed directly below the gate structures 150 and may be absent directly below the channel regions 120. According to another embodiment (not illustrated), the shielding layer 160 may be or may include a continuous layer. The shielding layer 160 may shield the gate structures 150 against the potential at the collector electrode 320.

In FIG. 6 the drain/drift region 130 includes a lightly doped drift zone 131 and sections of a patterned n conducting barrier layer 132, which are formed between the channel regions 120 and the drift zone 131. The sections of the patterned barrier layer 132 may separate the channel regions 120 and the drift zone 131 and may be exclusively formed directly below the channel regions 120. According to another embodiment (not illustrated), the barrier layer 132 may be or may include a continuous layer. The barrier layer 132 may improve carrier confinement and therefore may enhance the electron/hole plasma in the on-state of the voltage-controlled switching device 500.

The patterned barrier layer 132 of FIG. 6 and the patterned shielding layer 160 of FIG. 5 may be combined in the same semiconductor portion 100. For example, sections of the barrier layer 132 and sections of the shielding layer 160 may alternate along a horizontal direction parallel to the cross-sectional plane.

According to another embodiment, first regions of the semiconductor portion 100 may exclusively include sections of a patterned or continuous barrier layer 132, whereas outside the first regions the barrier layer 132 is absent. In addition or alternatively, second regions of the semiconductor portion 100 may exclusively include sections of a patterned or continuous shielding layer 160, whereas outside the second regions the shielding layer 160 is absent. The semiconductor portion 100 may include third regions in which both the barrier layer 132 and the shielding layer 160 are absent.

Instead of the continuous collector layer 140, each of the embodiments discussed with reference to FIGS. 5 and 6 may include a discontinuous collector layer 140 or a collector layer 140 including collector zones 141 as described with reference to FIG. 4B.

Figure 7A:
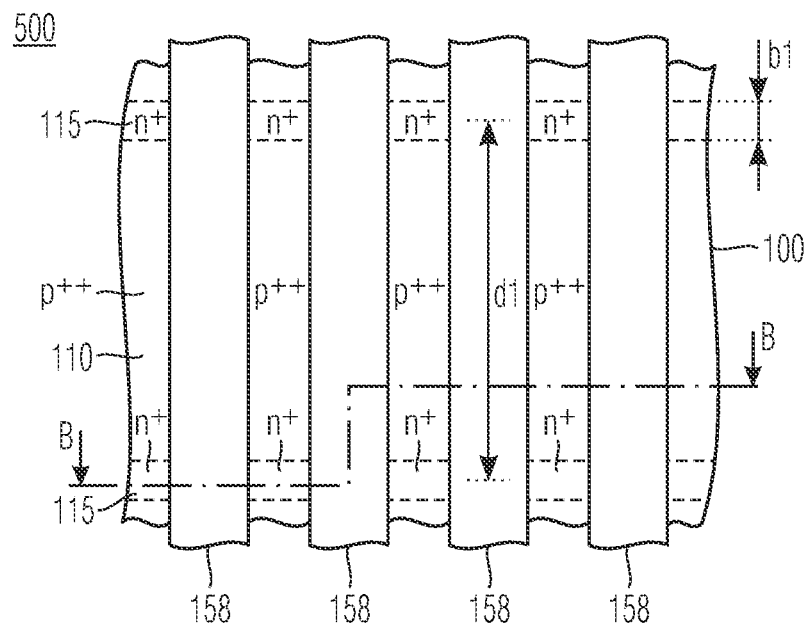
FIGS. 7A-7B show a simplified horizontal and a simplified vertical cross-sectional view of a portion of a voltage-controlled switching device according to an embodiment with n conducting pilot source regions.
Figure 7B:
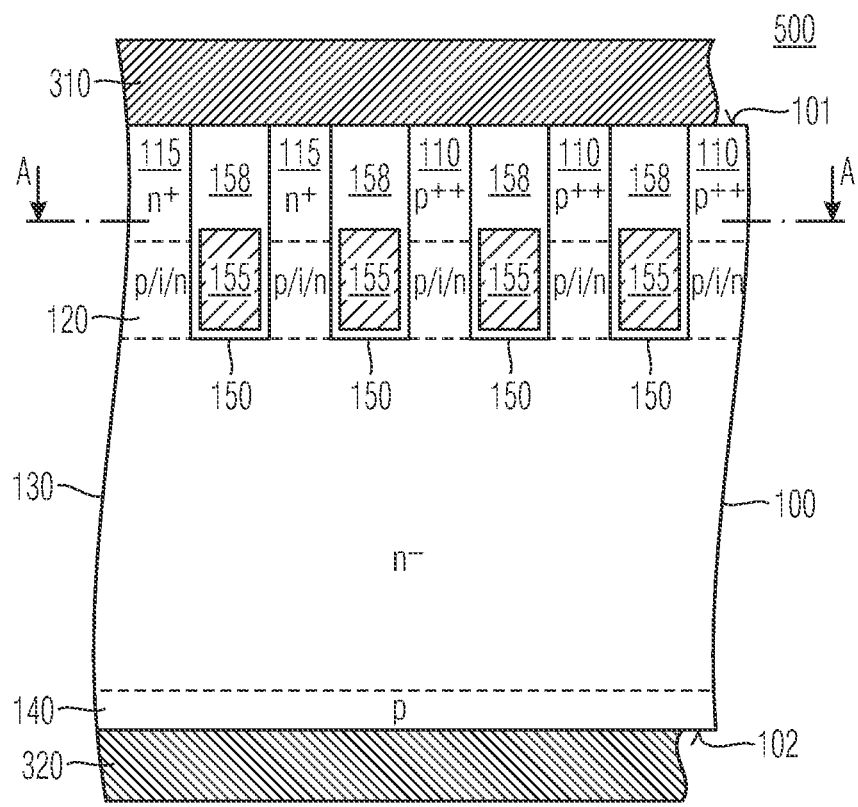

FIGS. 7A and 7B show a voltage-controlled switching device 500 that includes a plurality of n conducting pilot source regions 115. The non-conducting pilot source regions 115 and the p conducting source regions 110 alternate along a lateral direction parallel to the horizontal longitudinal axes of the gate structures 150.

The channel regions 120 in contact with the source regions 110 and the channel regions 120 in contact with the pilot source regions 115 may have the same doping. Alternatively, the doping in the channel regions 120 in contact with the pilot source regions 115 may differ from the doping in the channel regions 120 in contact with the source regions 110.

The emitter electrode 310 at the front side of the semiconductor portion 100 is in direct contact with both the source regions 110 and the pilot source regions 115. In particular, the emitter electrode 310 and the source regions 110 form low-resistive ohmic contacts and the emitter electrode 310 and the pilot source regions 315 form low-resistive ohmic contacts.

The pilot source regions 115 provide n channel MOSFETs with n*n structure in parallel to the TFETs in the control head of the voltage-controlled switching device 500.

The n channel MOSFET with n*n structure may be designed to soften the turn-on characteristic of the voltage-controlled switching device 500.

The pilot source regions 115, the source regions 110 and the channel regions 120 may be formed in the fins of the semiconductor portion 100 between neighboring gate structures 150.

Each pilot source region 115 may extend from a first one of two neighboring gate structures 150 to a second one of the two neighboring gate structures 150. A mean width b1 of the pilot source regions 115 along the horizontal longitudinal axes of the fins may be in a range from 100 nm to 1 µm. A mean center-to-center distance d1 between neighboring pilot source regions 115 formed in the same fin may be in a range from 500 nm to 100 µm.

An area ratio of the total horizontal area of the pilot source regions 115 of the first conductivity type to the total horizontal area of the source regions 110 of the second conductivity type may be in a range from 1:5 to 1:100. For example, the area ratio may be approximately 1:20.

Each of the embodiments discussed with reference to one of FIGS. 1 to 6 may be complemented with pilot source regions 115 as described with reference to FIGS. 7A and 7B.

The voltage-controlled switching devices 500 discussed with reference to any of the following FIGS. 8A to 10D may concern both devices with fully depletable channel region 120 and with not-fully depletable channel region 120.

Figure 8A:
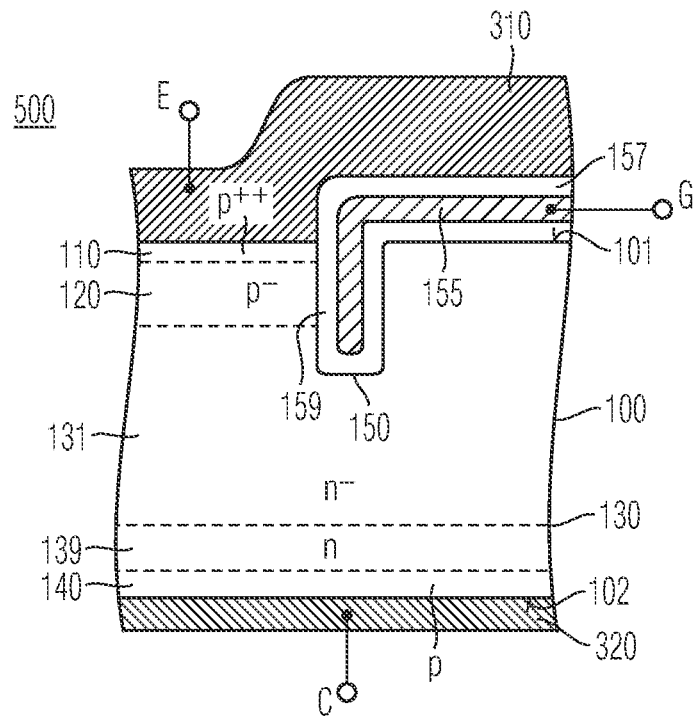
FIG. 8A shows a simplified vertical cross-sectional view of a portion of a voltage-controlled switching device according to a further embodiment with lightly p doped channel region.

FIG. 8A shows a voltage-controlled switching device 500 with a p conducting collector layer 140, an n conducting drain/drift region 130, a p conducting channel region 120 and a p conducting source region 110 stacked one on each other in this order between a first surface 101 and a second surface 102 of a semiconductor portion 100 of single crystalline silicon.

The drain/drift region 130 includes a lightly doped drift zone 131 and a more heavily doped buffer layer 139 between the drift zone 131 and the collector layer 140. An emitter electrode 310 formed on the first surface 101 and the source region 110 form a low-resistive ohmic contact. The emitter electrode 310 may form or may be electrically connected or coupled to an emitter terminal E. A collector electrode 320 formed on the second surface 102 and the collector layer 140 form a low-resistive ohmic contact. The collector electrode 320 may form or may be electrically connected or coupled to a collector terminal C.

A gate structure 150 includes a conductive gate electrode 155 and a gate dielectric 159, wherein the gate dielectric 159 separates the gate electrode 155 and the semiconductor material of the semiconductor portion 100. An interlayer dielectric 157 may separate the gate electrode 155 and the emitter electrode 310.

A vertical section of the gate structure 150 may extend from the first surface 101 down to beyond the channel region 120. The source region 110 and the channel region 120 are laterally in direct contact with the vertical section of the gate structure 150. The gate structure 150 may include a horizontal section formed on the first surface 101 above a section of the semiconductor portion in which the drain/drift region 130 extends up to the first surface 101.

No n conducting source region is formed between the emitter electrode 310 and the p conducting channel region 120. The p conducting source region 110 is a degenerate semiconductor. A transition of the doping level from the source region 110 to the channel region 120 is comparatively abrupt, e.g. in a range from one order of magnitude per 5 nm. A width of the channel region 120 from a first one of the neighboring gate structures 150 to an opposite second one may be at most 1000 nm, e.g. at most 800 nm or 500 nm.

Figure 8B:
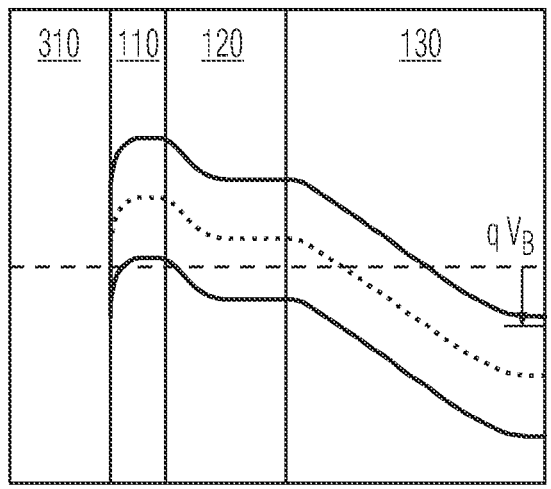
FIGS. 8B-8C show band diagrams for discussing operational modes of the voltage-controlled switching device illustrated in FIG. 8A.

The operational modes for the voltage-controlled switching device 500 of FIG. 8B are discussed with reference to the band diagrams in FIGS. 8B and 8C.

Figure 8C:
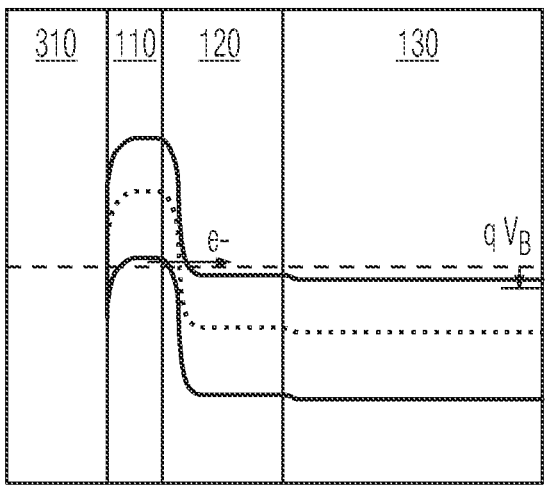

FIGS. 8B and 8C show the band diagrams effective in a vertical plane close to and parallel to the vertical section of the gate structure 150 at the side of the channel region 120.

As long as the gate-to-source voltage VGS is lower than the on-state threshold voltage Vthon as it is the case for the band diagram of FIG. 8B, the effect of the gate-to-source voltage VGS on the edges of conduction band and valence band in the channel region 120 is low and the pn junction between the channel region 120 and the drain/drift region 130 blocks, similar to the operation of a standard IGBT.

When the gate-to-source voltage VGS exceeds the on-state threshold voltage Vthon as it is the case for the band diagram of FIG. 8C, electrons accumulate in a first enhancement region and form an inversion channel vertically extending from the source region 110 to the drain/drift region 130. Electrons are injected through the reverse-biased band-to-band tunneling junction between the source region 110 and the inversion channel.

The tunneling electron injection depends on the tunneling barrier height, on the tunneling barrier width and on the electron effective mass, wherein the injection rate increases with decreasing tunneling barrier height and/or with decreasing tunneling barrier width. The tunneling barrier height depends on the semiconductor material forming the tunneling junction, on the doping level in the source region 110 and on the abruptness of the transition of the doping level from the source region 110 to the channel region 120.

Figure 9A:
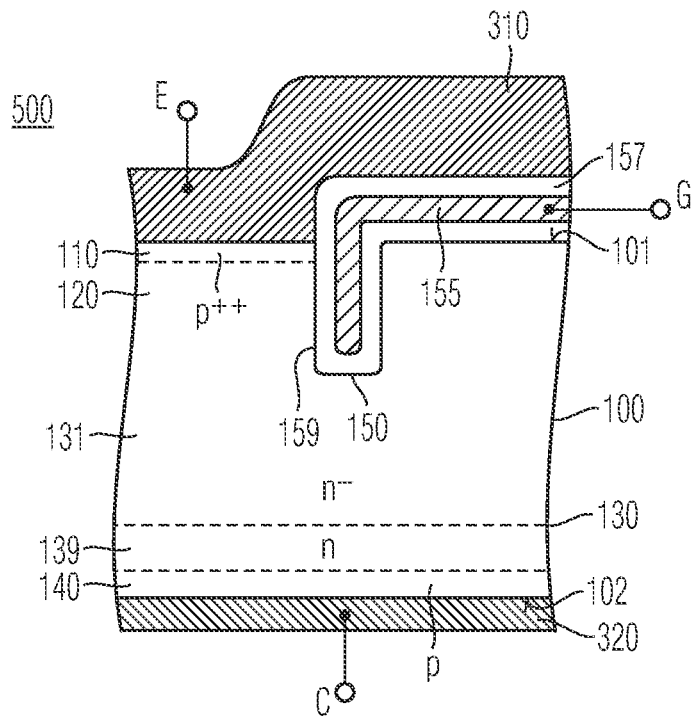
FIG. 9A shows a simplified vertical cross-sectional view of a portion of a voltage-controlled switching device according to a further embodiment with lightly n doped channel region.

In the voltage-controlled switching device 500 of FIG. 9A, a lightly n doped channel region 120 replaces the lightly p doped channel region 120 of FIG. 8A. The channel region 120 may have the same doping level as the adjoining portion of the drain/drift region 130.

Figure 9B:
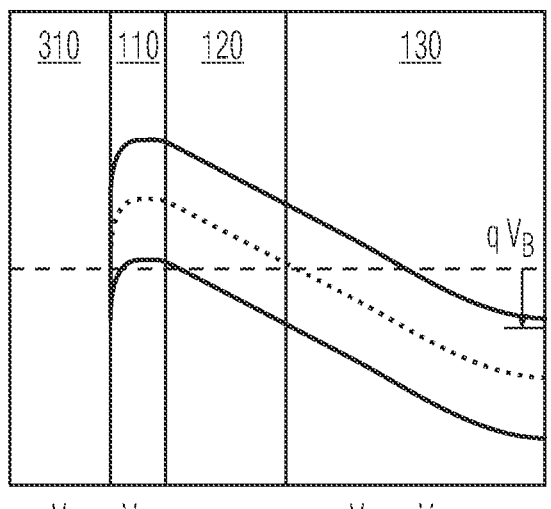
FIGS. 9B-9C show band diagrams for discussing operational modes of the voltage-controlled switching device illustrated in FIG. 9A.
Figure 9C:
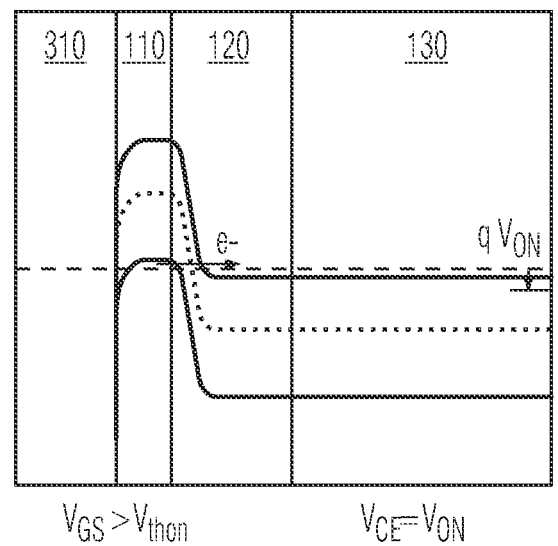

FIGS. 9B and 9C show the band diagrams effective in a vertical plane close to and parallel to the vertical section of the gate structure 150 at the side of the channel region 120.

As long as the gate-to-source voltage VGS is lower than the on-state threshold voltage Vthon as it is the case for the band diagram of FIG. 9B, the effect of the gate-to-source voltage VGS on the edges of conduction band and valence band in the channel region 120 is low and the pn junction between the source region 110 and the channel region 120 is blocking.

When the gate-to-source voltage VGS exceeds the on-state threshold voltage Vthon as it is the case for the band diagram of FIG. 9C, electrons accumulate in a first enhancement region and form an accumulation channel vertically extending from the source region 110 to the drain/drift region 130. Electrons are injected through the reverse-biased band-to-band tunneling junction between the source region 110 and the accumulation channel.

The tunneling electron injection depends on the tunneling barrier height, on the tunneling barrier width and on the electron effective mass, wherein the injection rate increases with decreasing tunneling barrier height and/or with decreasing tunneling barrier width. The tunneling barrier height depends on the semiconductor material forming the tunneling junction, on the doping level in the source region 110 and on the abruptness of the transition of the doping level from the source region 110 to the channel region 120.

The gate electrode 155 may include or consist of heavily doped p-type polycrystalline silicon and/or a metal, e.g. an elemental metal, a metal compound and/or a metal alloy with an appropriate work function to deplete the channel and to suppress formation of an accumulation layer at a gate-to-source voltage equal 0V. For example, the gate electrode 155 may include or consist of titanium (Ti).

Figure 10A:
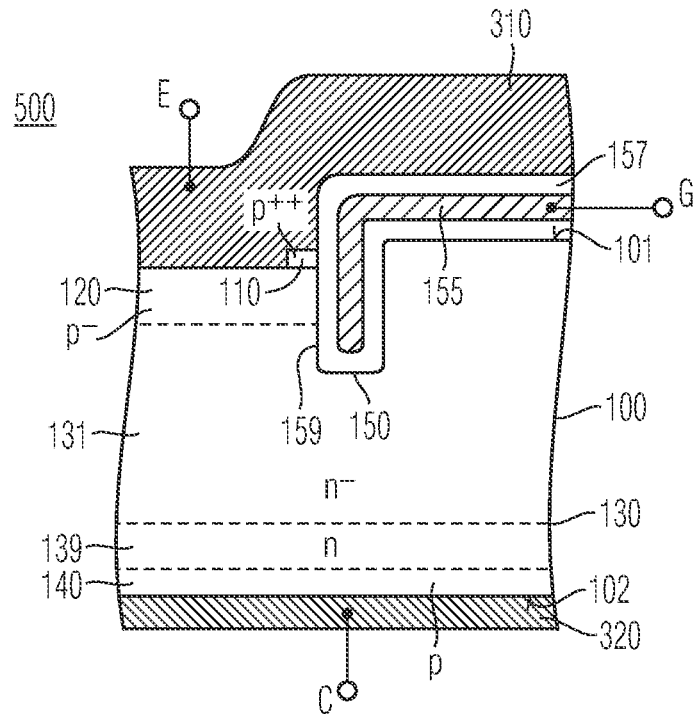
FIGS. 10A-10E show simplified vertical cross-sectional views of portions of voltage-controlled switching devices according to further embodiments.

In FIG. 10A the source region 110 is structured and formed only directly along the gate dielectric 159. At a distance to the gate dielectric 159 the emitter electrode 310 is in direct contact with the lightly p doped channel region 120. For RC-IGBTs, the size of the area covered by the heavily doped source region 110 as well as the doping level in the low doped channel region 120 effect the characteristics of the reverse conducting diode. Patterning the source region 110 allows tailoring characteristic parameters of the reverse conducting diode.

According to an embodiment, the source regions 110 or the source regions 110 and the channel regions 120 may include an auxiliary semiconductor material 119 having a lower bandgap with respect to a semiconductor material forming the drain/drift region 130. The lower bandgap at the source side may facilitate a higher tunnel current.

Figure 10B:
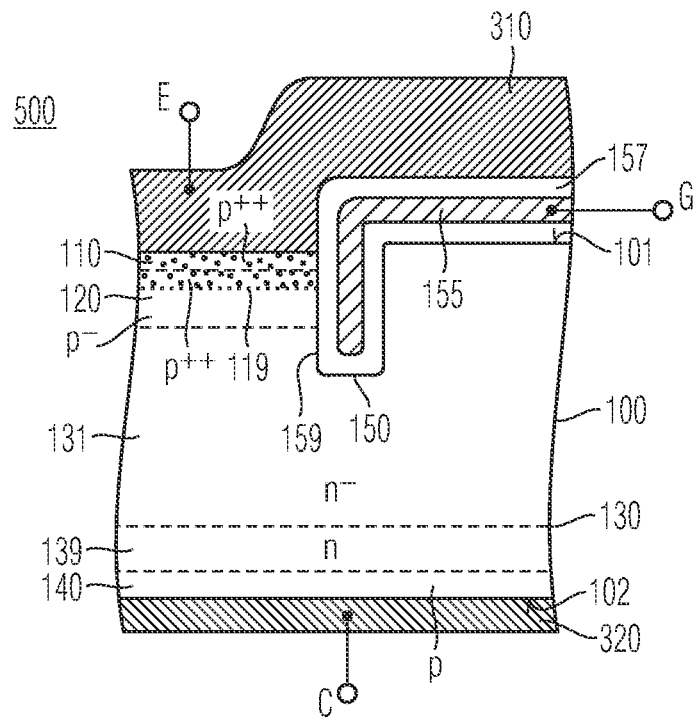

For example, in FIG. 10B the source region 110 and a portion of a p conducting channel region 120 directly adjoining the source region 110 are formed from an auxiliary semiconductor material 119 with a lower bandgap than the semiconductor material forming the main part of the semiconductor portion 100 including the drain/drift region 130. For example, at least a part of the region in which tunneling occurs, in particular the complete region in which tunneling occurs may be formed from the auxiliary semiconductor material 119. The material forming the main part of the semiconductor portion 100 may be crystalline silicon and the auxiliary semiconductor material 119 may include SiGe, Ge, SiGeSn and/or GeSn.

Figure 10C:
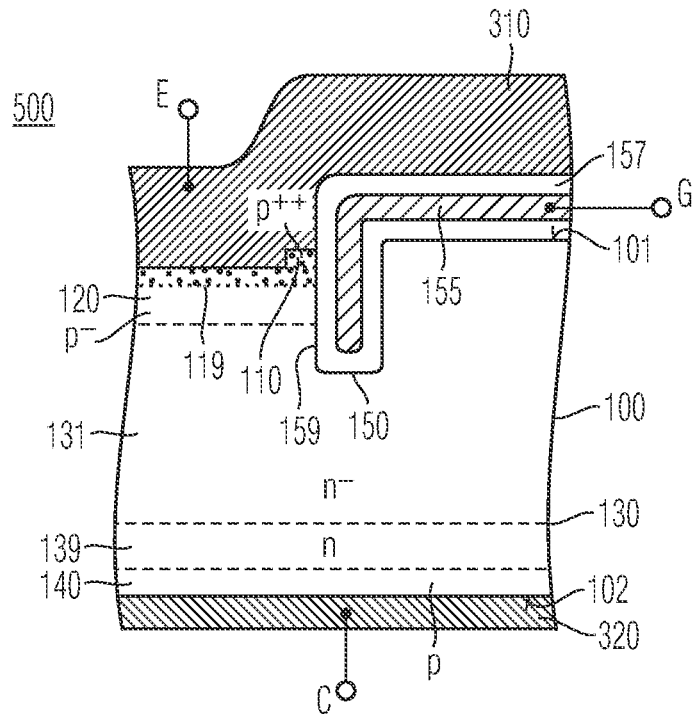

FIG. 10C provides the patterned source region 110 of FIG. 10A from the auxiliary semiconductor material 119 of FIG. 10B.

Figure 10D:
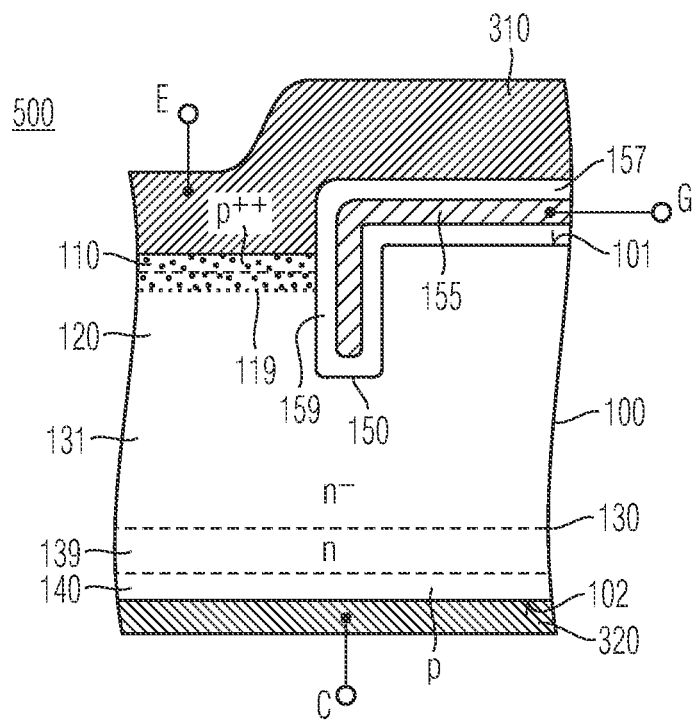

In FIG. 10D the source region 110 and a portion of an n conducting channel region 120 directly adjoining the source region 110 are formed from an auxiliary semiconductor material 119 that facilitates a higher tunnel current than silicon. For example, the semiconductor material 119 may include SiGe, Ge, SiGeSn and/or GeSn.

Figure 10E:
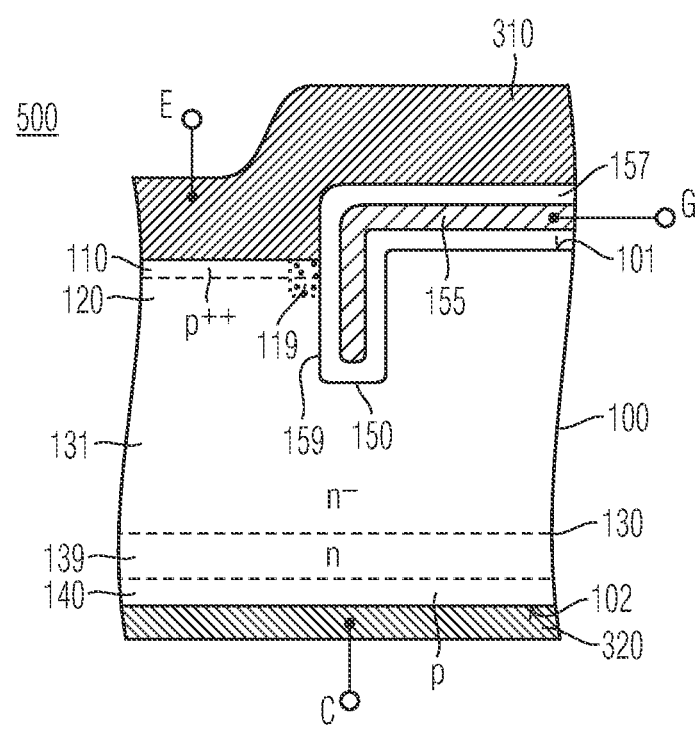

In FIG. 10E the auxiliary semiconductor material 119 is patterned and selectively formed only close to the gate structure 150 where the accumulation channel (or inversion channel in case of a p conducting channel region) forms in the on-state of the voltage-controlled switching device 500.

Each of the embodiments provides latch-up free operation and may be produced by slightly modifying proved and tested processes used for the manufacturing of standard IGBTs. The cell design can be easily scaled down to achieve higher carrier confinement.

Figure 11:
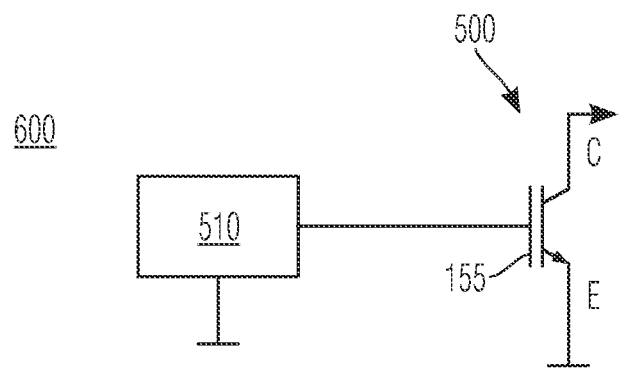
FIG. 11 is a schematic block diagram of a switching assembly with a gate driver circuit and a voltage-controlled switching device according to a further embodiment.

FIG. 11 shows a switching assembly 600 including a voltage-controlled switching device 500 as described with respect to any of the preceding figures and a gate driver circuit 510. In particular, the voltage-controlled switching device 500 may be or may include an IGBT with a control head including a TFET. A gate driver output of the gate driver circuit 510 and the gate electrode 155 of the voltage-controlled switching device 500 are electrically connected, either directly or through a low-resistive gate resistor element.

The gate driver circuit 510 is configured to alternately output an active gate signal turning on the voltage-controlled switching device 500 using a charge carrier channel including charge carriers of the first conductivity type and a turn-off gate signal turning off the voltage-controlled switching device 500 by using a charge carrier channel including charge carriers of the second conductivity type.

The turn-off gate signal and the active gate signal may strictly alternate (two-level operation). Alternatively, the gate driver circuit 510 may output a stationary off-stage voltage VGSoff between an active gate signal and a turn-off gate signal (three-level operation).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage-controlled switching device, comprising:
    a drain/drift region of a first conductivity type, wherein the drain/drift region is formed in a semiconductor portion;
    a channel region, wherein the channel region and the drain/drift region are in direct contact with each other;
    a source region of a second conductivity type, wherein the source region and the channel region are in direct contact with each other; and
    a gate electrode, wherein the gate electrode and the channel region are capacitively coupled and configured such that, in a an on-state of the voltage-controlled switching device, a first enhancement region of charge carriers corresponding to the first conductivity type forms in the channel region and band-to-band tunneling is facilitated between the source region and the first enhancement region.

2. The voltage-controlled switching device of claim 1, further comprising:
    a collector layer in direct contact with the drain/drift region, wherein the drain/drift region is formed between the collector layer and the channel region, and wherein the collector layer comprises a continuous collector layer of the second conductivity type or a plurality of laterally separated collector zones of the second conductivity type.

3. The voltage-controlled switching device of claim 1, wherein the gate electrode and the channel region are configured such that a second enhancement region of charge carriers corresponding to the second conductivity type forms in the channel region in a turn-off mode of the voltage-controlled switching device.

4. The voltage-controlled switching device of claim 1, wherein the gate electrode and the channel region are configured such that in the on-state of the voltage-controlled switching device, the first enhancement region extends across a complete cross-section of the channel region orthogonal to an on-state current flow direction.

5. The voltage-controlled switching device of claim 1, wherein the source region is p conductive and a p-type net dopant concentration in the source region is such that the Fermi level in the source region is in the valence band.

6. The voltage-controlled switching device of claim 1, wherein the gate electrode includes a first gate electrode section at a first side of the channel region and a second gate electrode section at an opposite second side of the channel region, and
    wherein the gate electrode is configured to fully deplete the channel region at a stationary off-state voltage.

7. The voltage-controlled switching device of claim 1, wherein the gate electrode is formed in gate structures extending from a first surface into the semiconductor portion, and
    wherein the channel region is formed in a fin of the semiconductor portion between neighboring gate structures.

8. The voltage-controlled switching device of claim 1, wherein a width w1 of the channel region from a first one of the neighboring gate structures to a second one is at most 100 nm.

9. The voltage-controlled switching device of claim 1, wherein the semiconductor portion is based on silicon and a net dopant concentration in the channel region is less than $5 \times 10^{16}$ cm$^{-3}$.

10. The voltage-controlled switching device of claim 1, wherein along a direction orthogonal to a junction between the source region and the channel region, a net dopant concentration drops by at least one order of magnitude per 5 nm into a direction of the channel region.

11. The voltage-controlled switching device of claim 1, further comprising:
    a pilot source region of the first conductivity type,
    wherein the channel region separates the pilot source region and the drain/drift region.

12. The voltage-controlled switching device of claim 1, further comprising:
    stripe-shaped gate structures having horizontal longitudinal axes extending along a lateral direction;
    a plurality of the pilot source regions and a plurality of the source regions,
    wherein the pilot source regions and the source regions alternate along a lateral direction parallel to the horizontal longitudinal axes of the stripe-shaped gate structures.

13. The voltage-controlled switching device of claim 1, wherein the source region or the source region and the channel region comprise an auxiliary semiconductor material having a lower bandgap than a semiconductor material forming the drain/drift region.

14. A switching assembly, comprising:
    the voltage-controlled switching device of claim 1; and
    a gate driver circuit,
    wherein a gate driver output of the gate driver circuit and the gate electrode of the voltage-controlled switching device are electrically connected,
    wherein the gate driver circuit is configured to alternately output an active gate signal turning on the voltage-controlled switching device, and a turn-off gate signal turning off the voltage-controlled switching device.

15. A voltage-controlled switching device, comprising:
    a drain/drift region of a first conductivity type, wherein the drain/drift region is formed in a semiconductor portion;
    a channel region, wherein the channel region and the drain/drift region are in direct contact with each other;
    a source region of a second conductivity type, wherein the source region and the channel region are in direct contact with each other, and wherein the source region separates the channel region and a first surface at a front side of the semiconductor portion; and
    a gate electrode, wherein the gate electrode and the channel region are capacitively coupled and configured such that, in a an on-state of the voltage-controlled switching device, a first enhancement region of charge carriers corresponding to the first conductivity type forms in the channel region and band-to-band tunneling is facilitated between the source region and the first enhancement region.

16. A switching assembly, comprising:
    the voltage-controlled switching device of claim 15; and
    a gate driver circuit,
    wherein a gate driver output of the gate driver circuit and the gate electrode of the voltage-controlled switching device are electrically connected,
    wherein the gate driver circuit is configured to alternately output an active gate signal turning on the voltage-controlled switching device, and a turn-off gate signal turning off the voltage-controlled switching device.

* * * * *

UNITED STATES PATENT AND TRADEMARK OFFICE
CERTIFICATE OF CORRECTION

PATENT NO. : 12,266,718 B2  
APPLICATION NO. : 17/668793  
DATED : April 1, 2025  
INVENTOR(S) : H. Thees et al.

Page 1 of 1

It is certified that error appears in the above-identified patent and that said Letters Patent is hereby corrected as shown below:

On the Title Page

Item (57)/Abstract, Lines 7-8, please change "in a an" to -- in an --

In the Claims

Column 19, Line 13 (Claim 1, Line 12) please change "in a an" to -- in an --

Column 20, Line 51 (Claim 15, Line 14) please change "in a an" to -- in an --

Signed and Sealed this  
Thirteenth Day of May, 2025

Coke Morgan Stewart  
*Acting Director of the United States Patent and Trademark Office*